US012660445B2

(12) United States Patent
Joo et al.

(10) Patent No.: US 12,660,445 B2
(45) Date of Patent: Jun. 16, 2026

(54) LIGHT EMITTING DISPLAY APPARATUS AND METHOD OF REPAIRING THE SAME

(71) Applicant: LG DISPLAY CO., LTD., Seoul (KR)

(72) Inventors: Eun Ji Joo, Paju-si (KR); Hyun Haeng Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 408 days.

(21) Appl. No.: 18/206,643

(22) Filed: Jun. 7, 2023

(65) Prior Publication Data

US 2024/0008325 A1     Jan. 4, 2024

(30) Foreign Application Priority Data

Jun. 29, 2022    (KR) ........................ 10-2022-0079663

(51) Int. Cl.
| | |
|---|---|
| *H10K 59/131* | (2023.01) |
| *G09G 3/3233* | (2016.01) |
| *H10K 59/12* | (2023.01) |
| *H10K 71/00* | (2023.01) |

(52) U.S. Cl.
CPC ......... *H10K 59/131* (2023.02); *G09G 3/3233* (2013.01); *H10K 59/1201* (2023.02); *H10K 71/861* (2023.02); *G09G 2300/0842* (2013.01)

(58) Field of Classification Search
CPC ............. H10K 59/131; H10K 59/1201; H10K 71/861; H10K 59/123; H10K 50/81; H10K 59/124; H10K 71/70; G09G 3/3233; G09G 2300/0842; G09G 3/006; G09G 2320/029; G09G 2330/08; G09G 2330/10
See application file for complete search history.

(56) References Cited

U.S. PATENT DOCUMENTS

| | | | | |
|---|---|---|---|---|
| 2007/0120476 A1* | 5/2007 | Park ....................... | H10D 86/40 |
| | | | 313/506 |
| 2018/0061908 A1* | 3/2018 | Shim .................. | H10K 59/1213 |
| 2022/0344625 A1* | 10/2022 | Jeon ................... | H10K 59/1216 |
| 2024/0155911 A1* | 5/2024 | Wang ................... | H10K 59/124 |
| 2024/0224634 A1* | 7/2024 | Zheng ................. | H10K 59/126 |

* cited by examiner

*Primary Examiner* — J. E. Schoenholtz

(74) *Attorney, Agent, or Firm* — Fish & Richardson P.C.

(57) ABSTRACT

A light emitting display apparatus includes a substrate, a lower metal layer disposed on the substrate, a driving transistor disposed on the lower metal layer, a connection electrode connected with an electrode of the driving transistor, and a light emitting diode including an anode electrode connected with the electrode of the driving transistor by the connection electrode, wherein the lower metal layer comprises a pattern portion exposing a portion of the connection electrode.

11 Claims, 19 Drawing Sheets

X   Repair

FIG. 22

LIGHT EMITTING DISPLAY APPARATUS AND METHOD OF REPAIRING THE SAME

CROSS-REFERENCE TO RELATED APPLICATION

This application claims the priority of Korean Patent Application No. 10-2022-0079663 filed on Jun. 29, 2022, which is hereby incorporated by reference in its entirety.

BACKGROUND

Field of the Disclosure

The present disclosure relates to a light emitting display apparatus and a method of repairing the same.

Description of the Background

As information technology advances, the market for display apparatuses which are connection mediums connecting a user with information is growing. Therefore, the use of display apparatuses such as light emitting display apparatuses, quantum dot display (QDD) apparatuses, and liquid crystal display (LCD) apparatuses is increasing.

The display apparatuses described above include a display panel which includes a plurality of subpixels, a driver which outputs a driving signal for driving the display panel, and a power supply which supplies power to the display panel or the driver.

In such display apparatuses, when the driving signal (for example, a scan signal and a data signal) is supplied to each of the subpixels provided in the display panel, a selected subpixel may transmit light or may self-emit light, and thus, an image may be displayed.

SUMMARY

Accordingly, the present disclosure is directed to a light emitting display apparatus and a method of repairing the same that substantially obviate one or more of problems due to limitations and disadvantages described above.

More specifically, the present disclosure is to provide an enhanced yield rate and decrease a time taken in a repair process, based on a repair structure and method (i.e., 1 point hole repair) capable of disconnecting a main current path through only one process when a defect of an element included in a subpixel occurs.

To achieve these and other advantages and in accordance with the present disclosure, as embodied and broadly described herein, a light emitting display apparatus includes a substrate, a lower metal layer disposed on the substrate, a driving transistor disposed on the lower metal layer, a connection electrode connected with an electrode of the driving transistor, and a light emitting diode including an anode electrode connected with the electrode of the driving transistor by the connection electrode, wherein the lower metal layer includes a pattern portion exposing a portion of the connection electrode.

The pattern portion may expose an electrical connection portion, electrically connecting the electrode of the driving transistor with the connection electrode, in a backside direction of the substrate.

The pattern portion may have a shape where a portion of one side of the lower metal layer is removed.

The pattern portion may have a hole shape where a portion of one side of the lower metal layer is removed.

The electrode of the driving transistor may include a portion including a semiconductor layer, and the connection electrode may include a portion including a gate metal layer disposed above the semiconductor layer.

The light emitting display apparatus may further include a buffer layer on the lower metal layer, the semiconductor layer disposed on the buffer layer and selected as the electrode of the driving transistor, the gate metal layer connected with the semiconductor layer, connected with the lower metal layer through a contact hole of the buffer layer, and selected as the connection electrode, a passivation layer disposed on the semiconductor layer and the gate metal layer, an overcoat layer disposed on the passivation layer, and a pixel electrode layer disposed on the overcoat layer, connected with the gate metal layer through a contact hole of the overcoat layer and of the passivation layer, and selected as an anode electrode of the light emitting diode.

Among the semiconductor layer, the lower metal layer and the gate metal layer, at least one layer is not overlapped with a different layer.

In another aspect of the present disclosure, a method of repairing a light emitting display apparatus includes a process of manufacturing a display panel including a plurality of subpixels each including a lower metal layer disposed on a substrate, a driving transistor disposed on the lower metal layer, a connection electrode connected with an electrode of the driving transistor, and a light emitting diode including an anode electrode connected with the electrode of the driving transistor by the connection electrode, the lower metal layer including a pattern portion exposing a portion of the connection electrode, a detecting process of detecting an abnormal subpixel from among the plurality of subpixels by using inspection of the display panel, and a repairing process of repairing the abnormal subpixel.

The repairing process may perform a cutting process of disconnecting an electrical connection portion where the electrode of the driving transistor is electrically connected with the connection electrode.

The cutting process may include an irradiating process of irradiating a laser beam onto an electrical connection portion exposed in a rearward direction of the substrate.

The pattern portion may have a shape where a portion of one side of the lower metal layer is removed.

The pattern portion may have a hole shape where a portion of one side of the lower metal layer is removed.

The electrode of the driving transistor may include a portion including a semiconductor layer, and the connection electrode may include a portion including a gate metal layer disposed above the semiconductor layer.

It is to be understood that both the foregoing general description and the following detailed description are exemplary and explanatory and are intended to provide further explanation of the disclosure as claimed.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with example embodiments of the disclosure.

It is to be understood that both the foregoing general description and the following detailed description are exemplary and explanatory and are intended to provide further explanation of the inventive concepts as claimed.

3
BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

Figure 17:
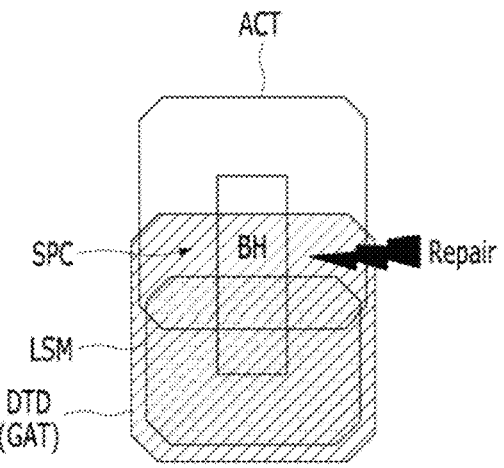
Figure 18:
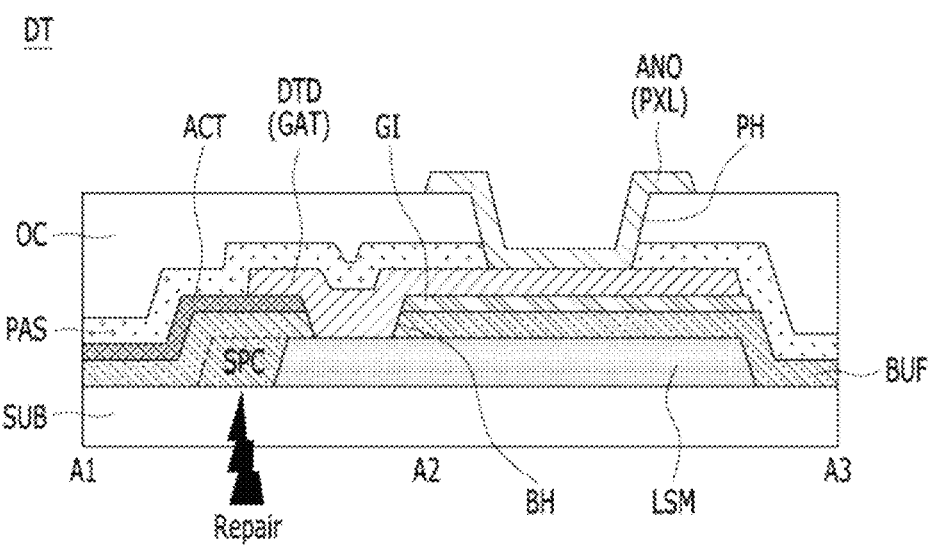
Figure 19:
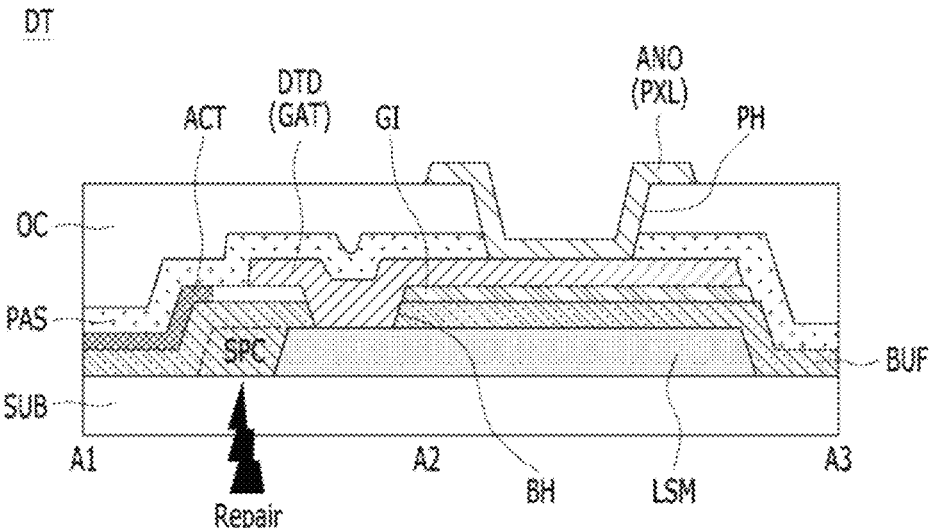
Figure 20:
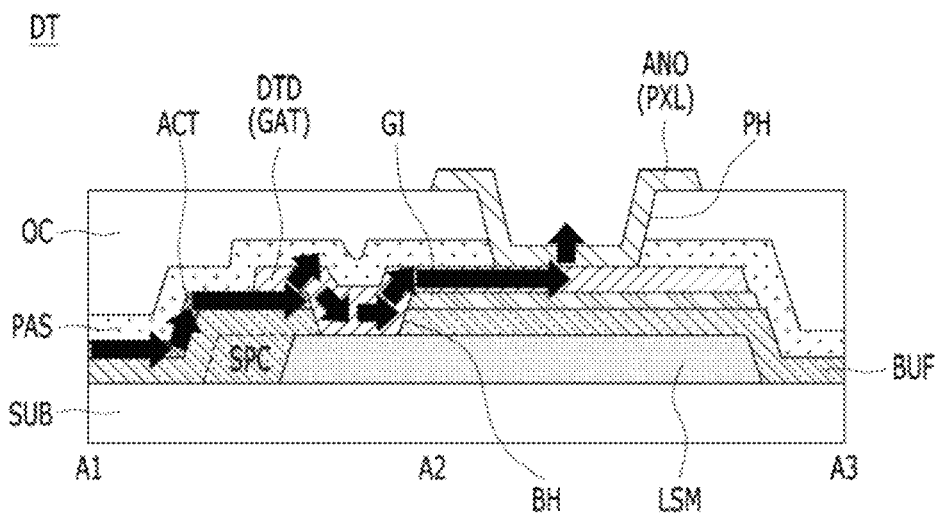
Figure 21:
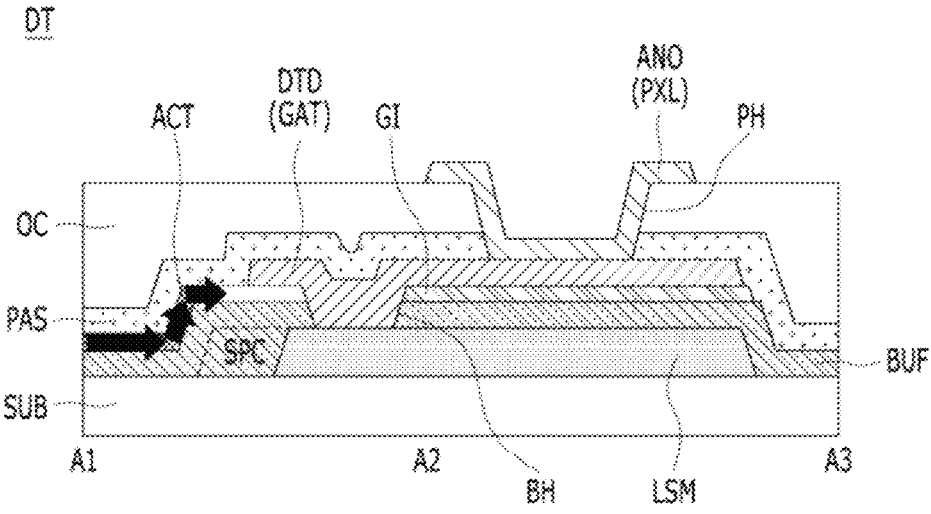
Figure 22:
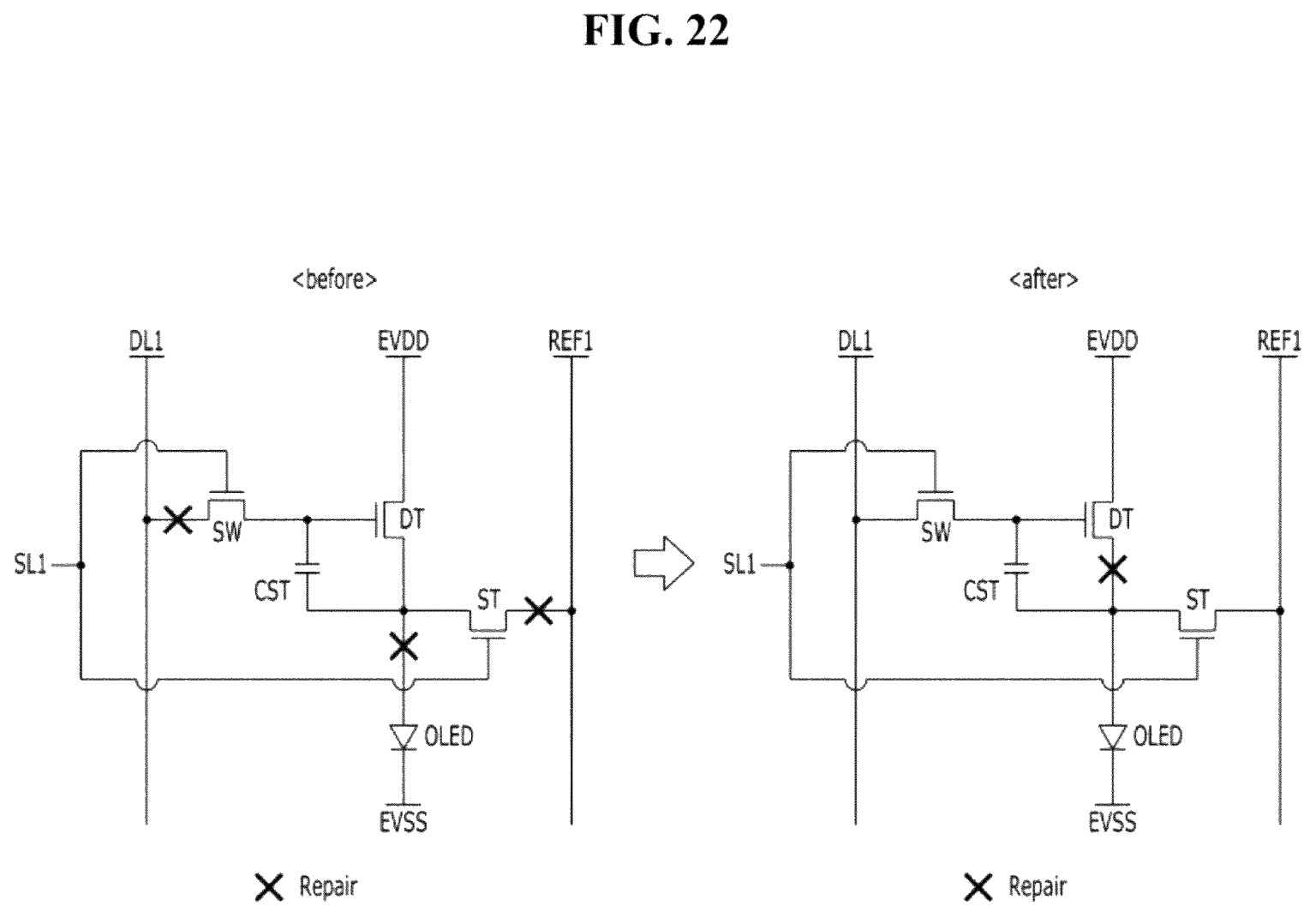
Figure 23:
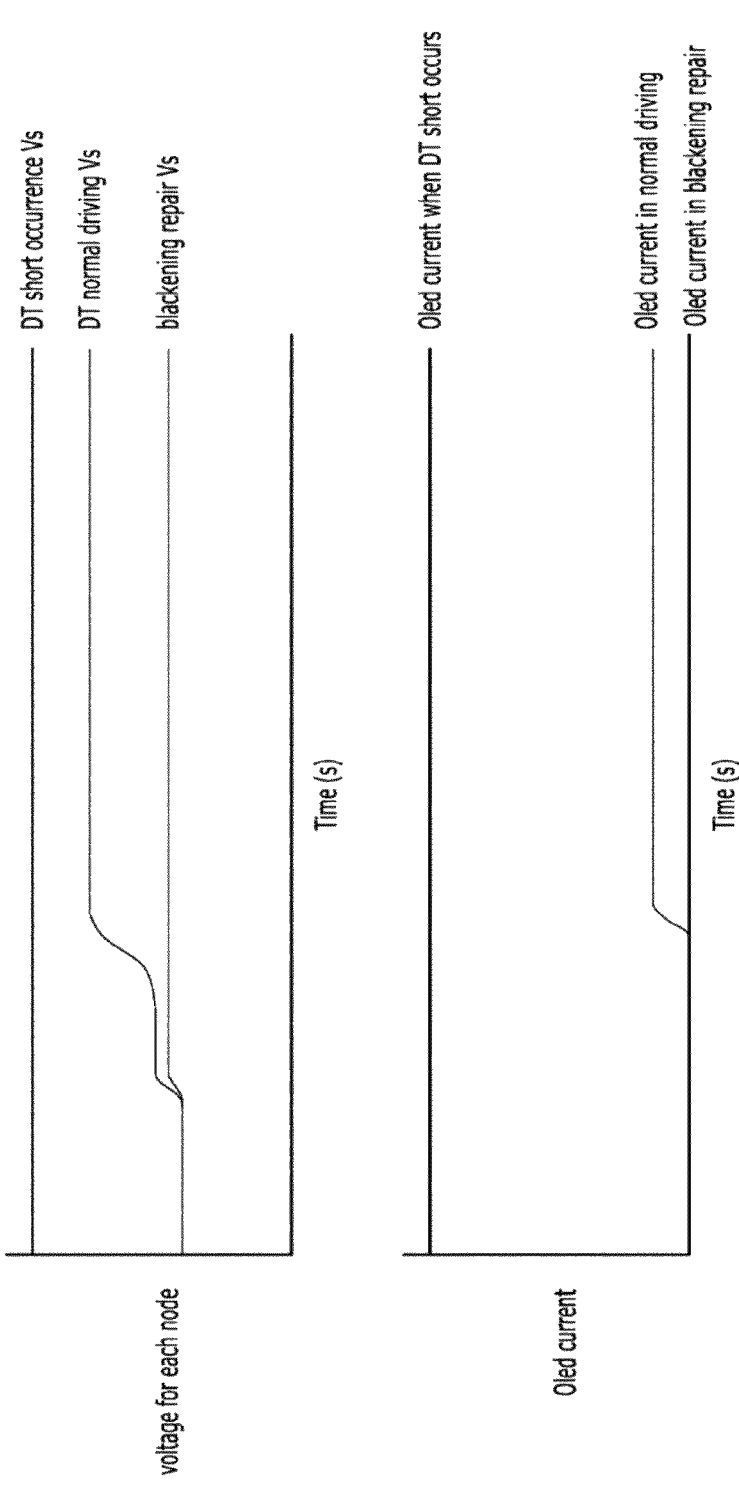
Figure 24:
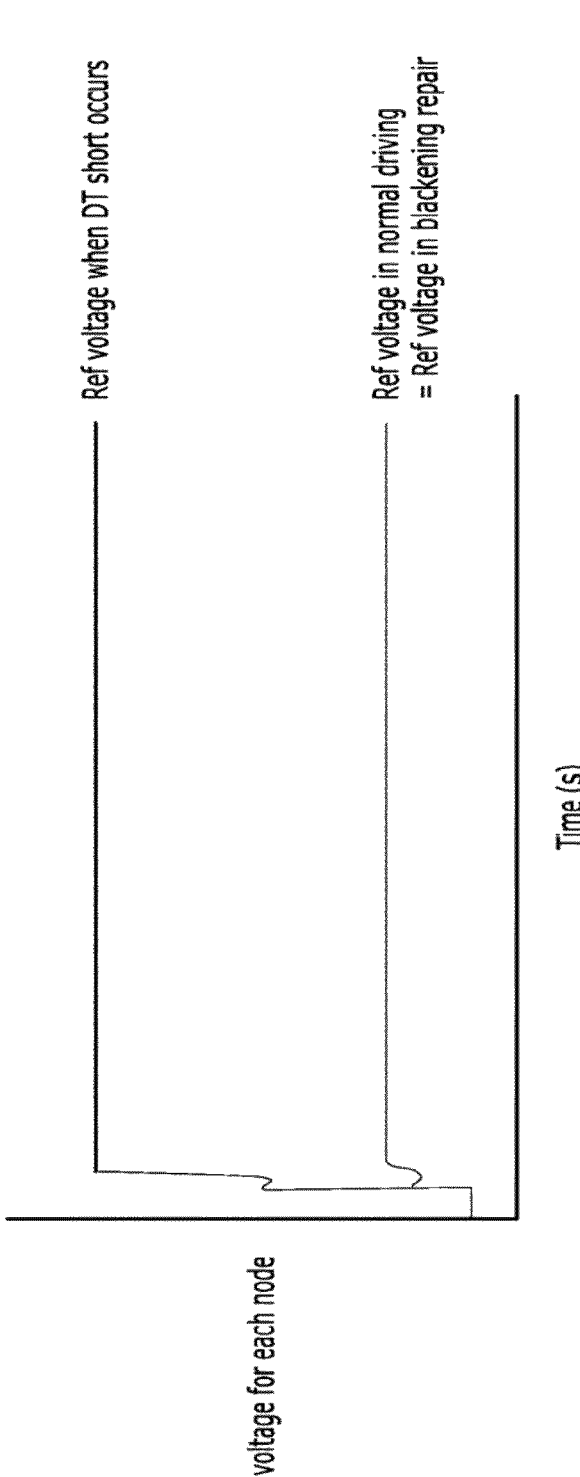
Figure 25:
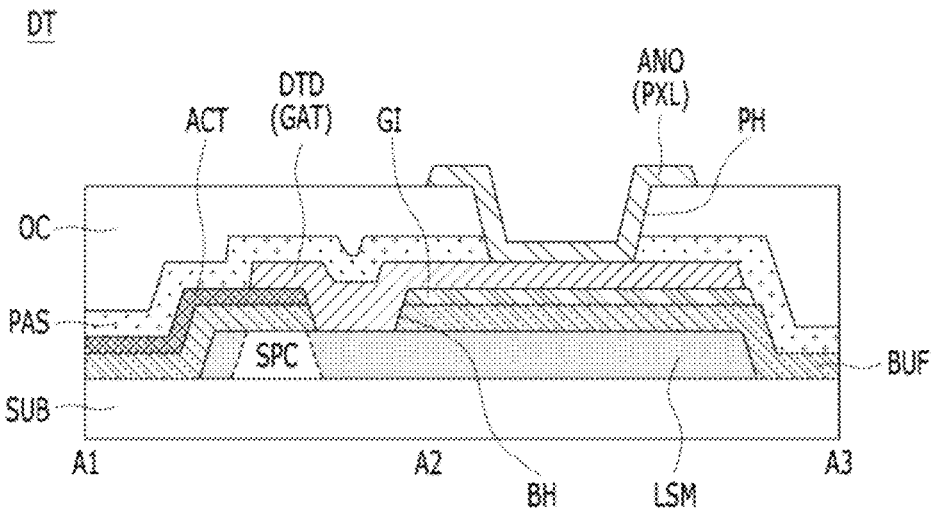
Figure 26:
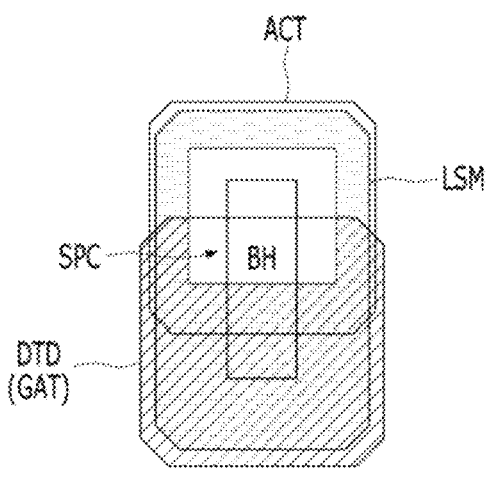
Figure 27:
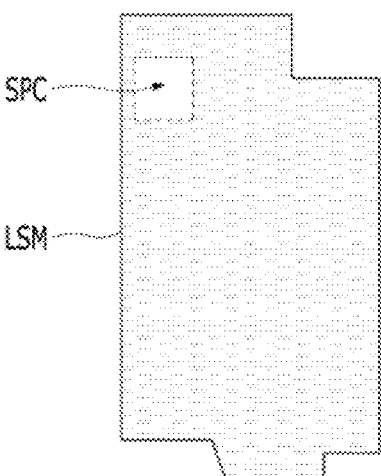

FIGS. 17 to 19 are diagrams for describing a repair method using a pattern portion according to the first aspect, FIGS. 20 and 21 are diagrams for describing a current path difference between a before-repairing process and an after-repairing process, and FIG. 22 is a diagram for describing a repair method according to the comparative example and a repair method according to a first aspect of the present disclosure;

FIGS. 23 and 24 show simulation results for describing improvements and voltage/current states of a subpixel before and after repair using the first aspect of the present disclosure; and FIGS. 25 to 27 are diagrams for describing a structure of a second aspect where one side of a connection electrode is not fully occluded by a lower metal layer and a portion thereof is exposed.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Hereinafter, the present disclosure will be described more fully with reference to the accompanying drawings, in which exemplary aspects of the disclosure are shown. The disclosure may, however, be embodied in many different forms and should not be construed as being limited to the aspects set forth herein; rather, these aspects are provided so that this disclosure will be thorough and complete, and will fully convey the concept of the disclosure to those skilled in the art.

The shapes, sizes, ratios, angles, numbers, and the like, which are illustrated in the drawings to describe various example embodiments of the present disclosure are merely given by way of example. Therefore, the present disclosure is not limited to the illustrations in the drawings. The same or similar elements are designated by the same reference numerals throughout the specification unless otherwise specified. In the following description where the detailed description of the relevant known function or configuration may unnecessarily obscure an important point of the present disclosure, a detailed description of such known function of configuration may be omitted.

In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included unless a more limiting term, such as "just," "immediate(ly)," or "direct(ly)," is used.

In describing elements of the present disclosure, when an element or layer is described as being "connected," "coupled," or "adhered" to another element or layer, the element or layer can not only be directly connected, coupled, or adhered to another that other element or layer, but also be indirectly connected, coupled, or adhered to that other another element or layer with one or more intervening elements or layers "disposed," or "interposed" between the elements or layers, unless otherwise specified.

When "comprise," "have," and "include" described in the present specification are used, another part may be added unless "only" is used. An element described in a singular form is intended to include a plurality of elements, and vice versa, unless the contrary context clearly indicates otherwise.

Any implementation described herein as an "example" is not necessarily to be construed as preferred or advantageous over other implementations.

In construing an element, the element is construed as including an error or tolerance range even where is no explicit description of such an error or tolerance range.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

A display apparatus according to the present disclosure may be applied to televisions (TVs), signal players, personal computers (PCs), home theaters, electronic devices for vehicles, and smartphones, but is not limited thereto. The display apparatus according to the present disclosure may be implemented as a light emitting display apparatus, a quantum dot display (QDD) apparatus, plasma display device, electrophoretic display device or a liquid crystal display (LCD) apparatus. Hereinafter, for convenience of description, a light emitting display apparatus self-emitting light on the basis of an inorganic light emitting diode or an organic light emitting diode as examples of light emitting elements will be described for example. A light emitting display apparatus may be implemented based on an inorganic light emitting diode, or may be implemented based on an organic light emitting diode. Hereinafter, for convenience of description, an example will be described where a light emitting display apparatus is implemented based on an organic light emitting diode.

Moreover, an example where a subpixel described below includes an n-type thin film transistor (TFT) will be described, but is not limited thereto and the subpixel may be implemented with a p-type TFT or with an n-type TFT and a p-type TFT. A TFT may be a three-electrode element including a gate, a source, and a drain. The source may be an electrode which provides a carrier to a transistor. In the TFT, a carrier may start to flow from the source. The drain may be an electrode where the carrier flows from the TFT to the outside. That is, in the TFT, the carrier flows from the source to the drain.

In the n-type TFT, because a carrier is an electron, a source voltage may be lower than a drain voltage so that the electron flows from the source to the drain. In the n-type TFT, because the electron flows from the source to the drain, a current may flow from the drain to the source. On the other hand, in the p-type TFT, because a carrier is a hole, a source voltage may be higher than a drain voltage so that the hole flows from the source to the drain. In the p-type TFT, because the hole flows from the source to the drain, a current may flow from the source to the drain. However, a source and a drain of a TFT are not fixed and may switch therebetween based on a voltage applied thereto. Therefore, the disclosure is not limited due to a source and a drain of a transistor. Based thereon, in the following description, one of a source and a drain will be described as a first electrode, and the other of the source and the drain will be described as a second electrode.

Figure 1:
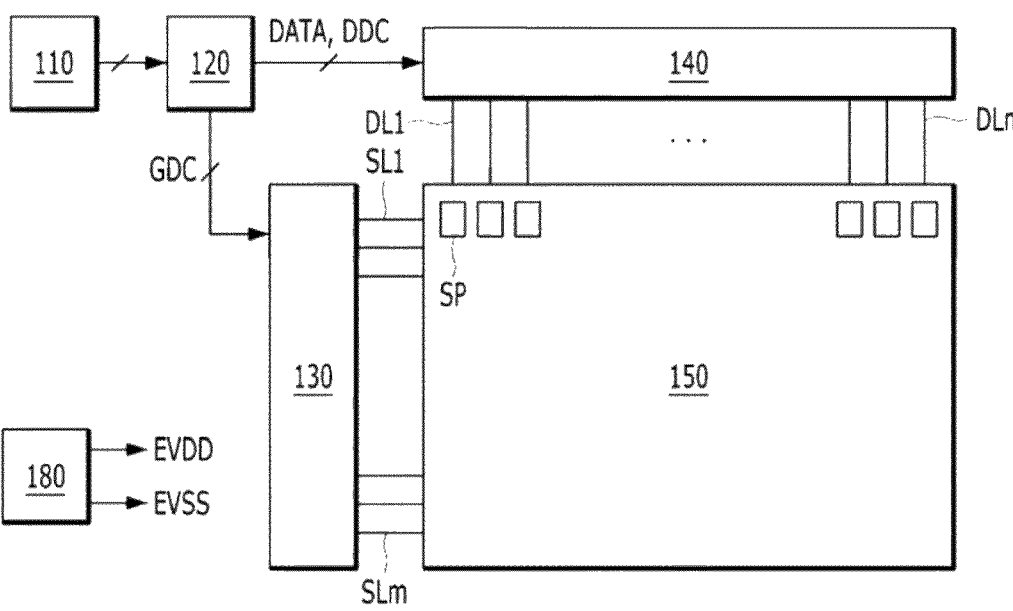
FIG. 1 is a block diagram schematically illustrating an organic electroluminescent display apparatus according to an aspect of the present disclosure.
Figure 2:
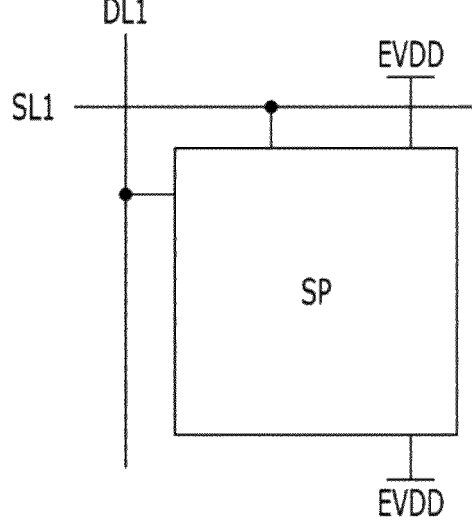
FIG. 2 is a block diagram schematically illustrating a subpixel illustrated in FIG. 1.

FIG. 1 is a block diagram schematically illustrating an organic electroluminescent display apparatus according to an aspect of the present disclosure, and FIG. 2 is a block diagram schematically illustrating a subpixel illustrated in FIG. 1.

As illustrated in FIGS. 1 and 2, the organic electroluminescent display apparatus according to an aspect of the present disclosure may include a signal supply unit 110, a timing controller 120, a scan driver 130, a data driver 140, a display panel 150, and a power supply 180.

The signal supply unit 110 (or a host system) may output a signal data signal supplied from the outside or a signal data signal and various driving signals stored in an internal memory thereof. The signal supply unit 110 may supply a data signal and the various driving signals to the timing controller 120. The signal supply unit 110 may be any one of various electronic devices such as a television system, a set-top box, a navigation system, a DVD player, a Blu-ray player, a personal computer (PC), a home theater system, a phone system, and the like.

The timing controller 120 may output a gate timing control signal GDC for controlling an operation timing of the scan driver 130, a data timing control signal DDC for controlling an operation timing of the data driver 140, and various synchronization signals (for example, a vertical synchronization signal Vsync and a horizontal synchronization signal Hsync). The timing controller 120 may control a display panel driving circuit including a scan driver 130 and a data driver 140 (described later) for writing data of an input image to subpixels of the organic electroluminescent display apparatus.

The timing controller 120 may provide the data driver 140 with the data timing control signal DDC and a data signal DATA supplied from the signal supply unit 110. The timing controller 120 may be implemented as an integrated circuit (IC) type and may be mounted on a printed circuit board (PCB), but is not limited thereto.

The scan driver 130 may output a scan signal (or a scan voltage) and an emission control signal in response to the gate timing control signal GDC supplied from the timing controller 120. The scan driver 130 may supply the scan signal to a plurality of subpixels, included in the display panel 150, through a plurality of scan lines SL1 to SLm (for example, gate lines) and may selects the subpixel that is charged with a data voltage through the scan line SL and adjust an emission timing. The scan driver 130 may be implemented as an IC type or may be directly provided on the display panel 150 in a gate-in panel (GIP) type, but is not limited thereto.

In response to the data timing control signal DDC supplied from the timing controller 120, the data driver 140 may sample and latch the data signal DATA supplied from the timing controller 120, convert the latched data signal into an analog data voltage on the basis of a gamma reference voltage, and output the converted analog data voltage.

The data driver 140 may respectively supply data voltages to the subpixels of the display panel 150 through a plurality of data lines DL1 to DLn. The data driver 140 may be implemented as an IC type or may be mounted on the display panel 150 or a PCB, but is not limited thereto.

The power supply 180 may generate and output a first power EVDD having a high level and a second power EVSS having a low level on the basis of an external input voltage supplied from the outside. The power supply unit 180 may generate and output a voltage (for example, a scan high voltage and a scan low voltage) needed for driving of the scan driver 130 or a voltage (for example, a drain voltage and a half drain voltage) needed for driving of the data driver 140, in addition to the first power EVDD and the second power EVSS.

The display panel 150 may display an image on the basis of a driving signal, including the scan signal and a data voltage output from a driver including the scan driver 130 and the data driver 140, and the first and second powers EVDD and EVSS output from the power supply 180. The display panel 150 may display an image, based on a pixel including a plurality of subpixels SP. The pixel may include red, green, and blue subpixels, or may include red, green, blue, and white subpixels, but is not limited thereto. Other color systems such as cyan, magenta, yellow and black might be adopted.

Hereinabove, each of the timing controller 120, the scan driver 130, and the data driver 140 has been described as an individual element. However, based on an implementation type of a light emitting display apparatus, one or more of the timing controller 120, the scan driver 130, and the data driver 140 may be integrated into one IC.

Figure 3:
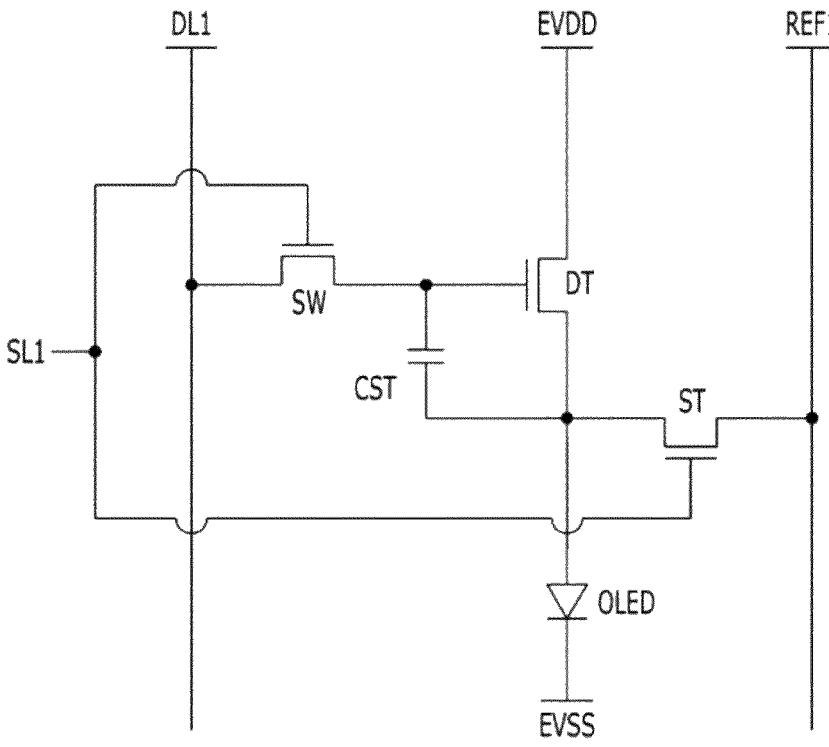
FIG. 3 is an equivalent circuit diagram illustrating a subpixel according to an aspect of the present disclosure.
Figure 4:
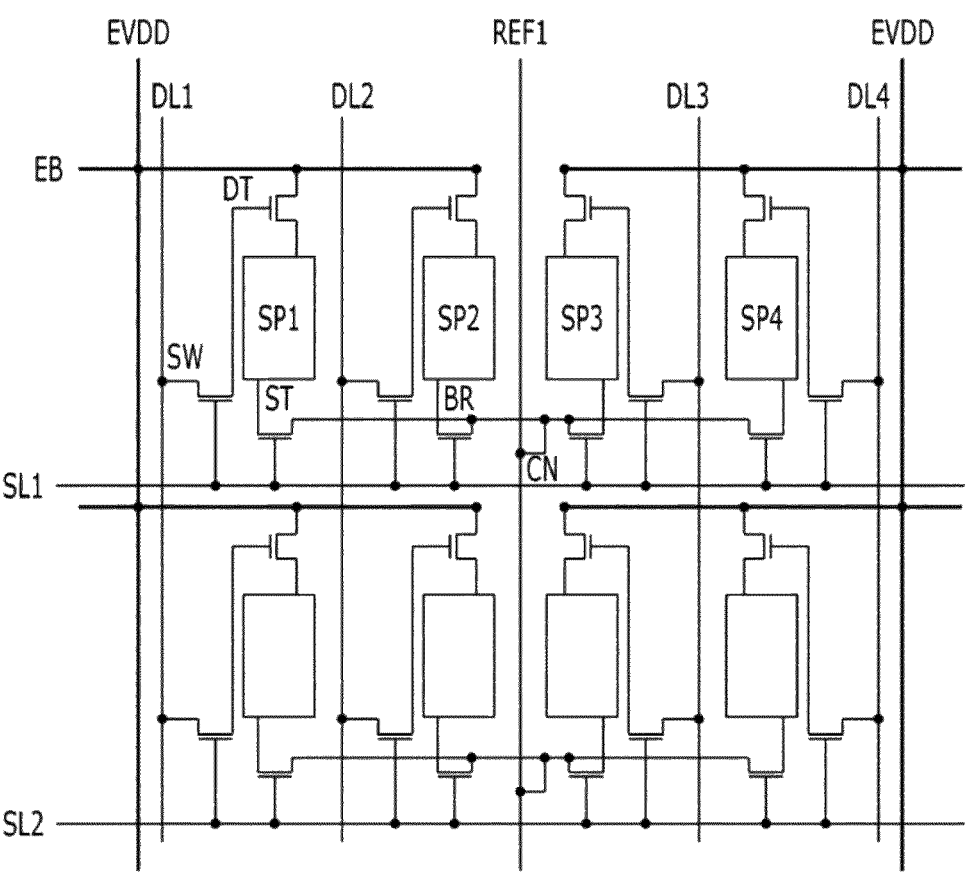
FIG. 4 is a circuit diagram schematically illustrating pixels implemented based on FIG. 3.

FIG. 3 is an equivalent circuit diagram illustrating a subpixel according to an aspect of the present disclosure, and FIG. 4 is a circuit diagram schematically illustrating pixels implemented based on FIG. 3.

As illustrated in FIG. 3, a subpixel may include a switching transistor SW, a sensing transistor ST, a driving transistor DT, a capacitor CST, and an organic light emitting diode OLED, but is not limited thereto. A subpixel may include more or less elements than above.

The driving transistor DT may include a gate electrode connected with a first electrode of the capacitor CST, a first electrode connected with a first power line EVDD, and a second electrode connected with an anode electrode of the organic light emitting diode OLED. The capacitor CST may include a first electrode connected with the gate electrode of the driving transistor DT and a second electrode connected with the anode electrode of the organic light emitting diode OLED. The organic light emitting diode OLED may include the anode electrode connected with the second electrode of the driving transistor DT and a cathode electrode connected with a second power line EVS S. The driving transistor DR may operate to flow a driving current between the first power line EVDD (e.g., high potential voltage) and the organic light emitting diode OLED in accordance with the data voltage stored in the storage capacitor Cst.

The switching transistor SW may include a gate electrode connected with a first scan line SL1, a first electrode connected with a first data line DL1, and a second electrode connected with the gate electrode of the driving transistor DT. The sensing transistor ST may include a gate electrode connected with the first scan line SL1, a first electrode connected with a first reference line REF1, and a second electrode connected with the anode electrode of the organic light emitting diode OLED. The switching transistor SW may perform a switching operation to store a data signal supplied through the first data line DL1 in the storage capacitor Cst as a data voltage in response to the scan signal supplied through the first scan line SL1.

The sensing transistor ST may be a compensation circuit which is added for compensating for a degradation or a threshold voltage of each of the driving transistor DT and the organic light emitting diode OLED. The sensing transistor ST may obtain a sensing value through a sensing node defined between the drain node of driving transistor DT and the organic light emitting diode OLED. The sensing value obtained from the sensing transistor ST may be transferred to an external compensation circuit, which is provided outside the subpixel, through the first reference line REF1. The first reference line REF1 may be a voltage application line for applying a reference voltage needed for sensing, or may be a sensing line for obtaining the sensing value.

The sensing transistor SENT can be turned on or off according to the sense signal supplied through first scan line SL1, which is another type of the gate line GL, and control an electrical connection between the first reference line REF1 and the drain node of the driving transistor DT.

The sensing transistor ST can be turned on by the sense signal having the turn-on level voltage, and transmit a voltage at the drain node of the driving transistor DT to the first reference line REF1.

The storage capacitor Cst may include a first electrode connected to the gate electrode of the driving transistor DT, and a second electrode connected to the drain node of the driving transistor DT. The storage capacitor Cst may be an external capacitor intentionally designed to be located outside of the driving transistor DT, other than an internal capacitor, such as a parasitic capacitor (e.g., a Cgs, a Cgd).

The anode electrode of the organic light emitting diode OLED may be connected to the drain electrode of the driving transistor DT, and its cathode electrode may be connected to the second power EVSS.

It should be understood that the sub-pixel structures shown in FIG. 3 are merely examples of possible sub-pixel structures for convenience of discussion, and example embodiments of the present disclosure may be implemented in any of various structures, as desired. For example, the sub-pixel SP may further include at least one transistor and/or at least one capacitor.

As illustrated in FIG. 4, a pixel may include a first subpixel SP1, a second subpixel SP2, a third subpixel SP3, and a fourth subpixel SP4. The first subpixel SP1 may emit red light, the second subpixel SP2 may emit white light, the third subpixel SP3 may emit blue light, and the fourth subpixel SP4 may emit green light, but the present disclosure is not limited thereto. One or more different colors may be emitted by subpixels, including yellow-green, black, etc, A first electrode of a switching transistor SW included in the first subpixel SP1 may be connected with the first data line DL1, a first electrode of a switching transistor SW included in the second subpixel SP2 may be connected with a second data line DL2, a first electrode of a switching transistor SW included in the third subpixel SP3 may be connected with a third data line DL3, and a first electrode of a switching transistor SW included in the fourth subpixel SP4 may be connected with a fourth data line DL4. Connections of the first subpixel SP1, the second subpixel SP2, the third subpixel SP3, and the fourth subpixel SP4 are not limited thereto. For example, a first electrode of a switching transistor SW included in the first subpixel SP1 may be connected with a second data line DL2, a first electrode of a switching transistor SW included in the second subpixel SP2 may be connected with a first data line DL1, a first electrode of a switching transistor SW included in the third subpixel SP3 may be connected with a fourth data line DL4, and a first electrode of a switching transistor SW included in the fourth subpixel SP4 may be connected with a third data line DL3.

First electrodes of driving transistors DT respectively included in the first subpixel SP1, the second subpixel SP2, the third subpixel SP3, and the fourth subpixel SP4 may be connected with the first power line EVDD in common. To provide a more detailed description, the first electrodes of driving transistors DT respectively included in the first subpixel SP1, the second subpixel SP2, the third subpixel SP3, and the fourth subpixel SP4 may be connected with a first power branch line EB of the first power line EVDD in common. Alternatively, first electrodes of the sensing transistors ST respectively included in the first subpixel SP1, the second subpixel SP2, the third subpixel SP3, and the fourth subpixel SP4 may be connected with different power branch lines of the first power line EVDD, respectively.

Gate electrodes of sensing transistors ST and the switching transistors SW respectively included in the first subpixel SP1, the second subpixel SP2, the third subpixel SP3, and the fourth subpixel SP4 may be connected with the first scan line SL1 in common. A second scan line SL2 may be disposed in a line next to the first scan line SL1. Alternatively, the second scan line SL2 may be disposed to be spaced apart from the first scan line SL1.

First electrodes of the sensing transistors ST respectively included in the first subpixel SP1, the second subpixel SP2, the third subpixel SP3, and the fourth subpixel SP4 may be connected with the first reference line REF1 in common. To provide a more detailed description, first electrodes of the sensing transistors ST respectively included in the first subpixel SP1, the second subpixel SP2, the third subpixel SP3, and the fourth subpixel SP4 may be connected with a first reference branch line BR of the first reference line REF1 in common. Alternatively, first electrodes of the sensing transistors ST respectively included in the first subpixel SP1, the second subpixel SP2, the third subpixel SP3, and the fourth subpixel SP4 may be connected with different reference branch lines of the first reference line REF1, respectively. The first reference line REF1 may be disposed between the third data line DL3 and the second data line DL2. The first reference line REF1 may be electrically connected with the first reference branch line BR by a first reference connection line CN, but is not limited thereto, and the first reference line REF1 may be disposed between other data lines.

Figure 5:
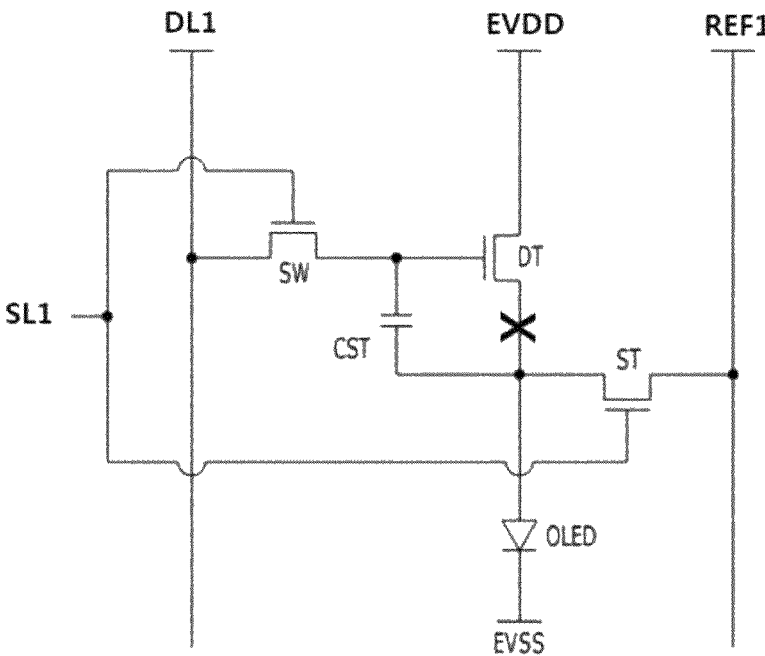
FIG. 5 is a circuit diagram for schematically describing a repair method according to an aspect of the present disclosure.
Figure 6:
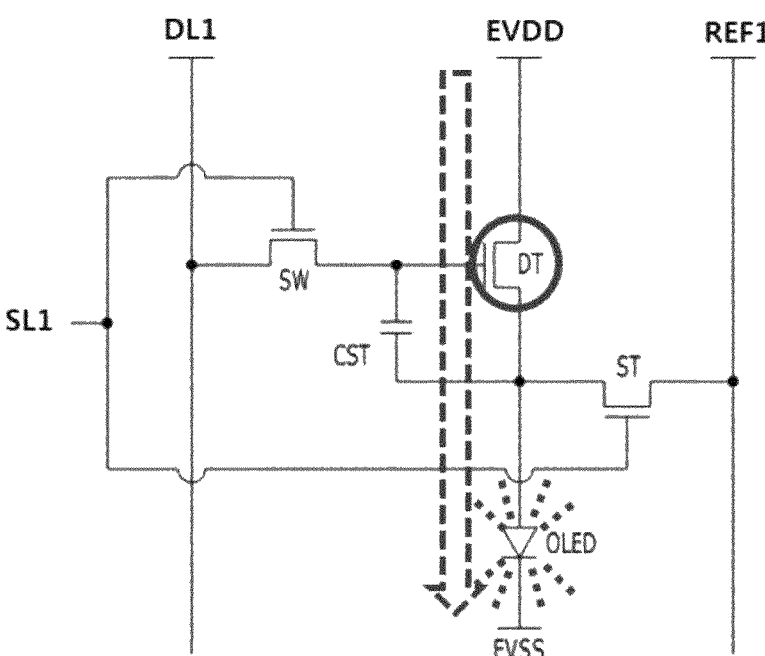
FIGS. 6 and 7 are circuit diagrams for describing processes before and after applying a repair method according to an aspect of the present disclosure.
Figure 7:
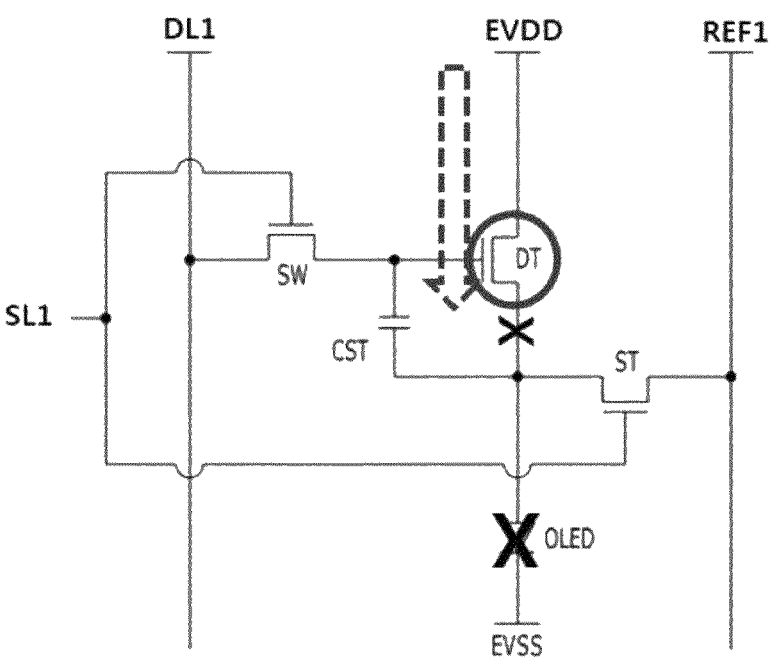

FIG. 5 is a circuit diagram for schematically describing a repair method according to an aspect of the present disclosure, and FIGS. 6 and 7 are circuit diagrams for describing processes before and after applying a repair method according to an aspect of the present disclosure.

As illustrated in FIG. 5, the repair method (the repair method is to make the subpixel into a non-drivable state.) according to an aspect may be performed based on a cutting process of electrically disconnecting an electrical connection portion (e.g., electrode) which is between a driving transistor DT and an organic light emitting diode OLED and electrically connects the driving transistor DT with the organic light emitting diode OLED.

The repair method may be performed on an abnormal subpixel incapable of performing a normal operation. Whether a subpixel is an abnormal subpixel may be detected based on various methods such as lighting inspection, driving inspection, and electrical characteristic inspection.

As illustrated in FIG. 6, a normal subpixel may perform a normal operation with power and a signal supplied from the outside and may emit light for expressing a desired gray level.

Generally, in the normal subpixel, a driving current may be generated based on an operation of a driving transistor DT, and the driving current generated from the driving transistor DT may be applied through an anode electrode of an organic light emitting diode OLED. As a result, the organic light emitting diode OLED may emit light having specific brightness, based on the driving current.

As illustrated in FIG. 7, an abnormal subpixel may not perform a normal operation even when power and a signal are supplied from the outside and may not emit light for expressing a desired gray level.

Generally, a portion of the abnormal subpixel connected with one or more of a driving transistor DT, a switching transistor SW, a capacitor CST, a sensing transistor ST, and an organic light emitting diode OLED may be in an abnormal or breakdown state (for example, due to a process defect). When there is a process defect such as short circuit, an overcurrent may be flow in through a first power line EVDD, and due to this, fire or the breakdown of a peripheral device may occur.

Therefore, in an aspect, a subpixel having a process defect may be blackened or darkened by a cutting process of disconnecting an electrical connection portion (e.g., a current path) between the driving transistor DT and the organic light emitting diode OLED. In an aspect, by disconnecting only one electrical connection portion (e.g., current path) which is between a first power line EVDD and a second power line EVSS and through which a driving current generated from the driving transistor DT flows, a time taken in a repair process may be minimized (reduced). In the present embodiment, an abnormal operation of a display apparatus caused by the overcurrent may be prevented, thereby enhancing the reliability and stability of a display apparatus.

Hereinafter, elements associated with a repair method and a repair structure according to an aspect will be described in more detail.

Figure 8:
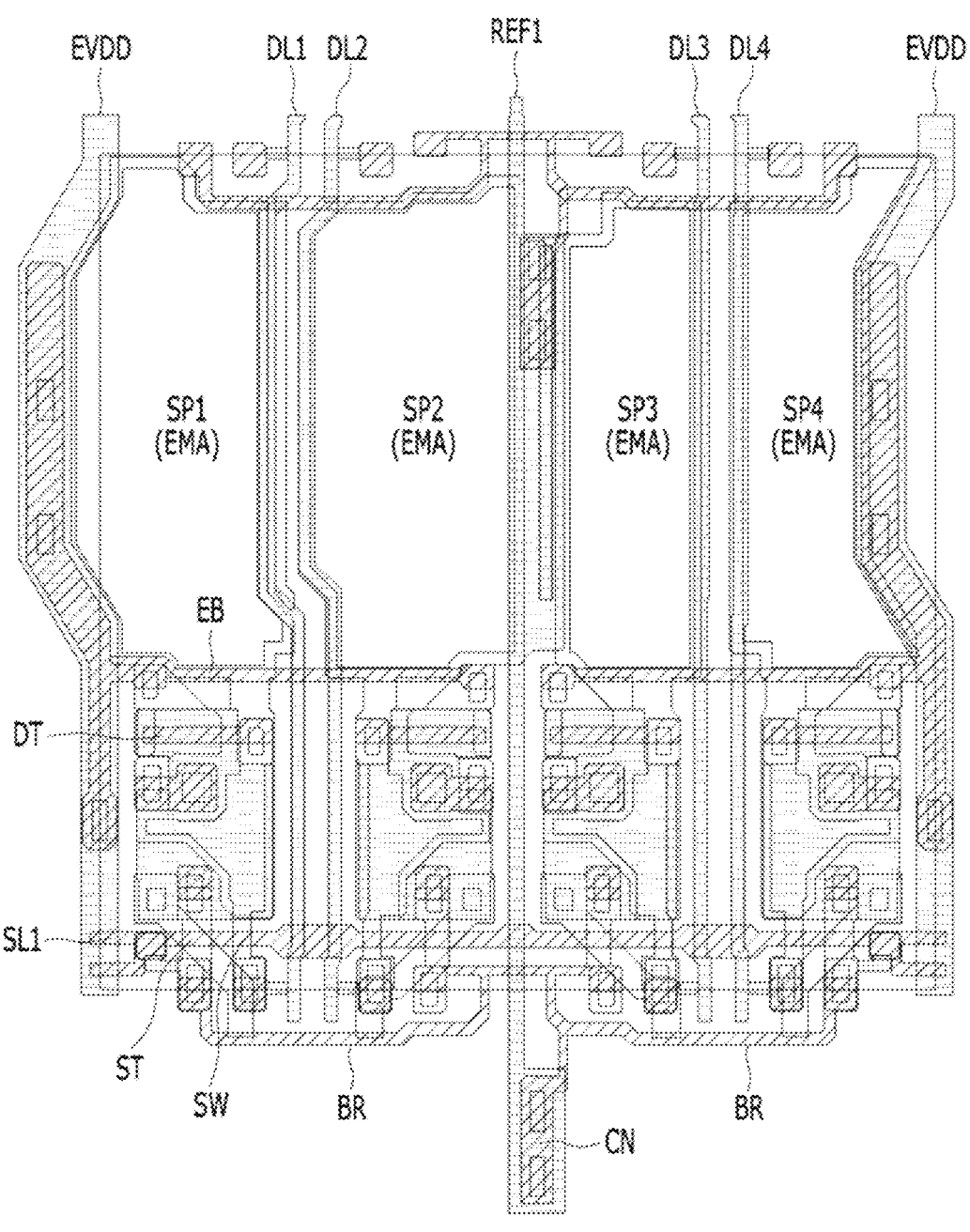
FIG. 8 is a plan view illustrating a pixel according to an aspect of the present disclosure.
Figure 9:
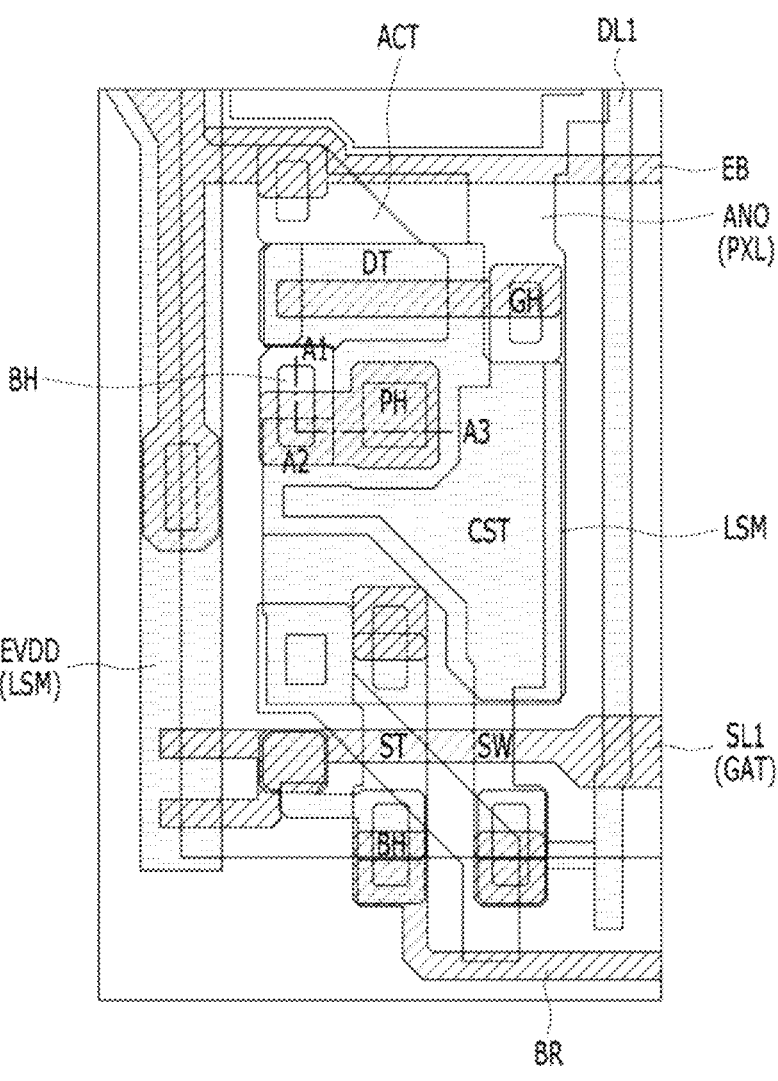
FIG. 9 is a plan view illustrating in more detail a portion of a first subpixel illustrated in FIG. 8.
Figure 10:
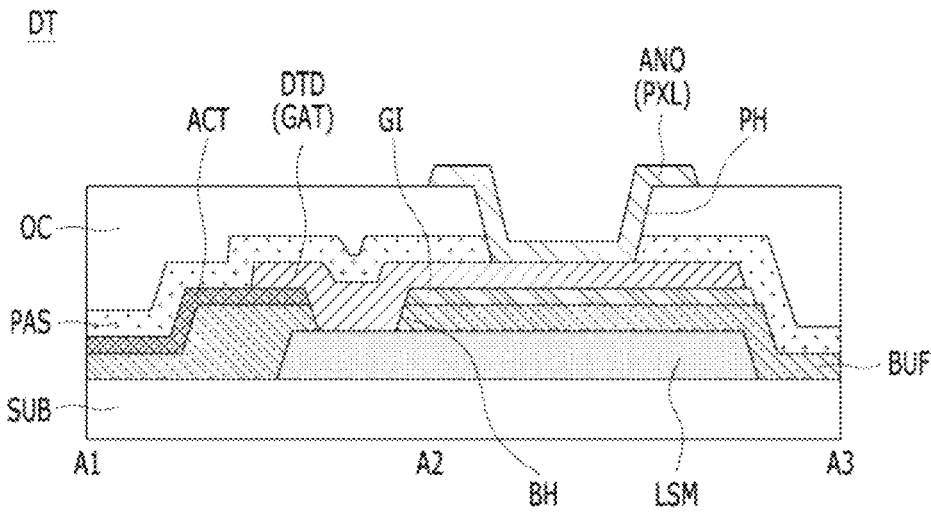
FIG. 10 is a cross-sectional view of region A1-A3 illustrated in FIG. 9.

FIG. 8 is a plan view illustrating a pixel according to an aspect of the present disclosure, FIG. 9 is a plan view illustrating in more detail a portion of a first subpixel illustrated in FIG. 8, and FIG. 10 is a cross-sectional view of region A1-A3 illustrated in FIG. 9.

As illustrated in FIG. 8, a first subpixel SP1, a second subpixel SP2, a third subpixel SP3, and a fourth subpixel SP4 may be defined by two first power lines EVDD, four data lines DL1 to DL4, one first reference line REF1 arranged in a vertical direction (a first direction), four data lines DL1 to DL4, one first reference line REF1, and one first scan line SL1 arranged in a horizontal direction (a second direction). Embodiments of the disclosure are not limited thereto, and more or less subpixels may be defined. In addition, the first and second directions may be other directions such as an inclined direction, etc. as long as they are intersected with each other. Further, there may be power line, data line, scan line and reference line disposed in other directions and/or of other numbers to define subpixels.

Each of the first subpixel SP1, the second subpixel SP2, the third subpixel SP3, and the fourth subpixel SP4 may include an emission region EMA. The emission region EMA may be a region which emits light and may include an organic light emitting diode.

Furthermore, in FIG. 8, a structure where a first power line EVDD, a first data line DL1, and a second data line DL2 are not straight lines due to different sizes of emission regions EMA and partially protrude to a left side at a periphery of the emission region EMA is described for example, but the present disclosure is not limited thereto. That is, the first subpixel SP1, the second subpixel SP2, the third subpixel SP3, and the fourth subpixel SP4 may include emission regions EMA having different sizes, and thus, some lines may not be straight lines for example, but the present disclosure is not limited thereto.

A circuit region (or a non-emission region) may be disposed under the emission region EMA (in the plane view). A driving transistor DT, a capacitor CST, a switching transistor SW, and a sensing transistor ST may be provided in the circuit region. Also, a first power branch line EB arranged in a horizontal direction, a first scan line SL1, a first reference branch line BR and a first reference connection line CN arranged in a vertical direction may be provided in the circuit region. Furthermore, an example is described where the first reference branch line BR is electrically connected with a first reference line REF1, based on the first reference connection line CN, but the present disclosure is not limited thereto.

As illustrated in FIGS. 8 to 10, the driving transistor DT, the capacitor CST, the switching transistor SW, the sensing transistor ST, the first power branch line EB, the first scan line SL1, and the first reference branch line BR provided in the circuit region may be formed based on a structure including but not limited to a lower metal layer LSM, a semiconductor layer ACT, a gate metal layer GAT, and a pixel electrode layer PXL. Also, an electrode and an electrode, a layer and a layer, a line or line or any two or more of an electrode, a layer or a line provided in the circuit region may be electrically connected with each other through a hole structure including but not limited to contact holes GH, PH, and BH.

GH may be defined as a contact hole for electrically connecting the gate metal layer GAT with the semiconductor layer ACT, PH may be defined as a contact hole for electrically connecting the gate metal layer GAT with the pixel electrode layer PXL, and BH may be defined as a contact hole for electrically connecting the lower metal layer LSM with the gate metal layer GAT.

The lower metal layer LSM may be disposed in the circuit region of a substrate SUB. The lower metal layer LSM may be formed for preventing external light from penetrating into the semiconductor layer ACT of the driving transistor DT and may be a layer which is formed just on the substrate SUB to electrically connect an electrode with an electrode or a line with an electrode.

A buffer layer BUF covering the lower metal layer LSM may be disposed on the substrate SUB. An example where the buffer layer BUF is formed of a single layer may be described, but the buffer layer BUF may be formed of a multilayer. The buffer layer BUF may be formed of an inorganic material, such as silicon oxide SiOx or silicon nitride SiNx. For example, inorganic films in multiple layers may be formed by alternately stacking one or more silicon oxide (SiOx) films, one or more silicon nitride (SiNx) films, and one or more amorphous silicon (a-Si), but the present disclosure is not limited thereto.

The buffer layer BUF may be disposed on the substrate, on which the elements are formed, to cover the elements. The buffer layer BUF may serve to protect the thin film transistor formed by a subsequent process from impurities such as alkali ion leaking from the light-shielding layer LS or the substrate. In addition, the buffer layer BUF may be omitted as necessary.

The buffer layer BUF may include a region where the semiconductor layer ACT is not provided and a region where the semiconductor layer ACT is provided. The region where the semiconductor layer ACT is not provided may be a region where the lower metal layer LSM overlaps with the gate metal layer GAT, and the region where the semiconductor layer ACT is provided may be a region which overlaps with a gate electrode of the driving transistor DT and includes a first electrode, a channel region, and a second electrode of the driving transistor DT. According to an example embodiment of the present disclosure, the semiconductor layer ACT may be used as an electrode of the driving transistor DT. For example, the electrode of the driving transistor DT may comprise a portion including a semiconductor layer ACT.

A gate insulation layer GI may be disposed on the buffer layer BUF where the semiconductor layer ACT is disposed. The gate insulating layer GI may be formed of an inorganic insulating material such as silicon oxide SiOx or silicon nitride SiNx. In addition, the gate insulating layer GI may be composed of a single layer or multilayers, but is not limited thereto. A connection electrode DTD, which is electrically connected with the semiconductor layer ACT of the driving transistor DT and is electrically connected with the lower metal layer LSM through a first contact hole BH, may be provided the gate insulation layer GI. The connection electrode DTD may be selected as the gate metal layer GAT used as the gate electrode of the driving transistor DT. The connection electrode DTD may comprise a portion including a gate metal layer GAT disposed above the semiconductor layer ACT. One side of the connection electrode DTD may be disposed on the semiconductor layer ACT of the driving transistor DT, and the other side of the connection electrode DTD may be disposed on the gate insulation layer GI.

A passivation layer PAS covering the connection electrode DTD and the semiconductor layer ACT of the driving transistor DT may be disposed on the buffer layer BUF. The passivation layer PAS may be formed of an organic insulating material, such as photo acryl, benzocyclobutene, but is not limited thereto, the passivation layer PAS may be constituted by inorganic insulating material, such as a single layer made of a silicon oxide (SiOx) film, a silicon nitride (SiNx) film, or a silicon oxynitride (SiOxNy) film or a multilayer film thereof, etc. An overcoat layer (or an organic layer) OC may be disposed on the passivation layer PAS. An anode electrode ANO of an organic light emitting diode may be disposed on the overcoat layer OC. The anode electrode ANO of the organic light emitting diode may be selected as a pixel electrode layer PXL and may be electrically connected with the connection electrode DTD through a second contact hole PH.

According to an aspect, when seen from the backside direction of the substrate SUB, a portion of the one side of the connection electrode DTD may be exposed through the lower metal layer LSM. In describing a portion relevant thereto, a structure of a comparative example and a structure of an aspect will be individually described below.

Figure 11:
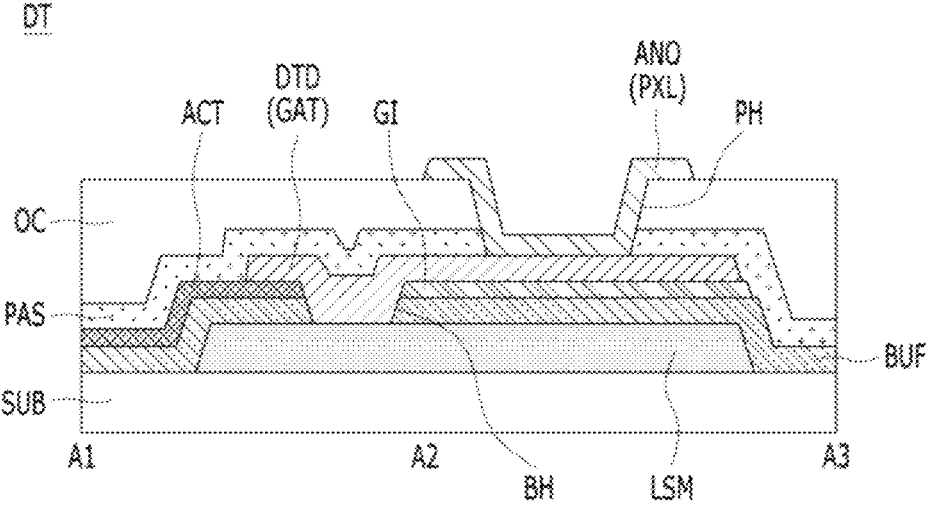
FIGS. 11 to 13 are diagrams for describing a structure of a comparative example where one side of a connection electrode is fully occluded by a lower metal layer.
Figure 12:
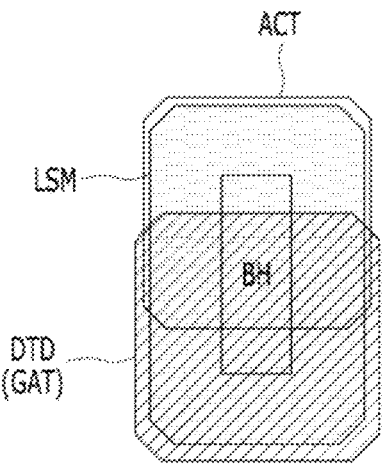
Figure 13:
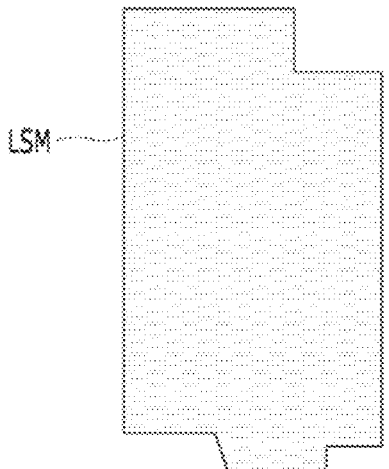
Figure 14:
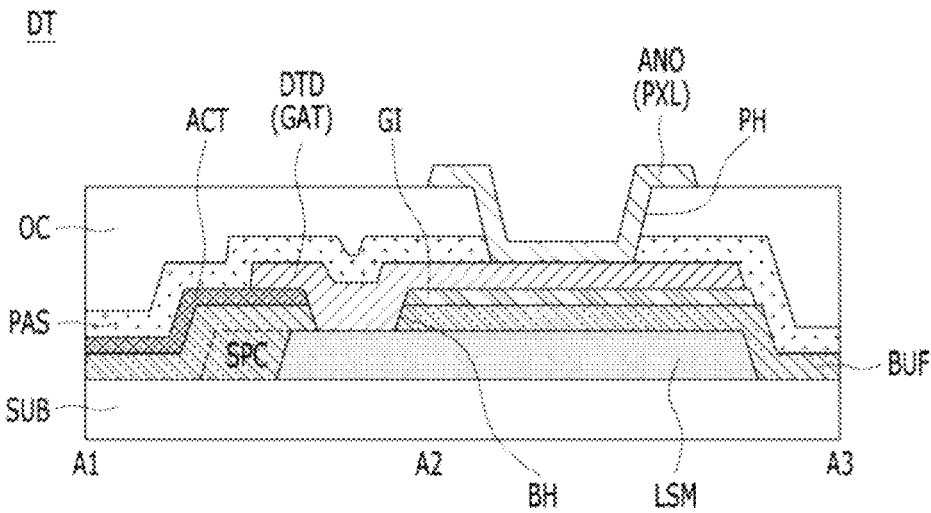
FIGS. 14 to 16 are diagrams for describing a structure of a first aspect where one side of a connection electrode is not fully occluded by a lower metal layer and a portion thereof is exposed.
Figure 15:
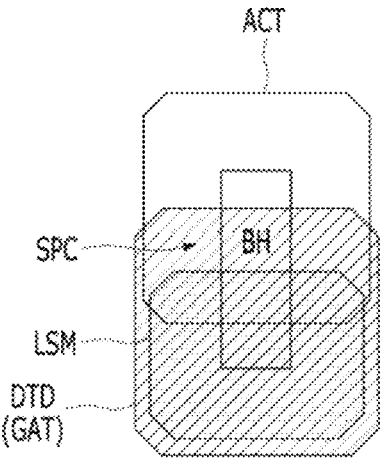
Figure 16:
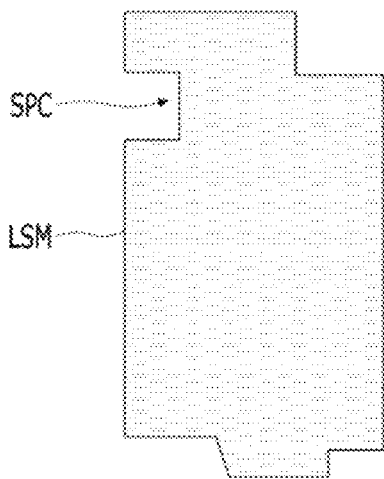

FIGS. 11 to 13 are diagrams for describing a structure of a comparative example where one side of a connection electrode is fully occluded by a lower metal layer, and FIGS. 14 to 16 are diagrams for describing a structure of a first aspect where one side of a connection electrode is not fully occluded by a lower metal layer and a portion thereof is exposed.

Referring to a cross-sectional view of FIG. 11, in the comparative example, one side of a connection electrode DTD may be fully occluded by a lower metal layer LSM. Referring to a plan view of FIG. 12, in the comparative example, at least two layers of the lower metal layer LSM, a semiconductor layer ACT, and the connection electrode DTD may overlap with each other at a periphery of a first contact hole BH. Referring to a plan view of FIG. 13, the lower metal layer LSM of the comparative example may have a polygonal shape and may have a straight left-right lateral structure and a nonstraight upper-lower lateral structure (a structure including a protrusion portion at upper and lower surfaces).

Referring to a cross-sectional view of FIG. 14, in the first aspect, one side of a connection electrode DTD may not be fully occluded by one side of a lower metal layer LSM and a portion thereof may be exposed. Referring to a plan view of FIG. 15, in the first aspect, at least two layers of the lower metal layer LSM, a semiconductor layer ACT, and the connection electrode DTD may overlap with each other at a periphery of a first contact hole BH, and at least one layer (for example ACT) may not overlap with a different layer.

Referring to a plan view of FIG. 16, the lower metal layer LSM of the first aspect may have a polygonal shape and may have a straight right lateral structure, a nonstraight left lateral structure (a structure having a shape SPC, where a portion of a left lateral structure is removed and pulled to an inner side thereof, or a shape which is recessed inward when seen from a left lateral surface), and a nonstraight upper-lower lateral structure (a structure including a protrusion portion at upper and lower surfaces), but are not limited thereto. Alternatively, the lower metal layer LSM may have a nonstraight lateral structure in any side due to protrusion or recess.

Hereinafter, in the first aspect, a portion which is removed so that a portion of a left side of the lower metal layer LSM is pulled to an inner side so as to expose a portion of the one side of the connection electrode DTD may be referred to as a pattern portion SPC. In FIG. 8, as seen from a region where the lower metal layer LSM is provided and a direction in which the first contact hole BH is formed, the pattern portion SPC may be disposed on a left lateral surface, and moreover, may be disposed on a right lateral surface. Hereinafter, therefore, the pattern portion SPC provided on one side of the lower metal layer LSM will be described. Furthermore, the pattern portion SPC may be formed adjacent to the first contact hole BH through a patterning process of removing a portion of the one lateral surface of the lower metal layer LSM, and a method of forming the pattern portion SPC is not limited thereto.

FIGS. 17 to 19 are diagrams for describing a repair method using a pattern portion according to the first aspect, FIGS. 20 and 21 are diagrams for describing a current path difference between a before-repairing process and an after-repairing process, and FIG. 22 is a diagram for describing a repair method according to the comparative example and a repair method according to the first aspect.

As illustrated in FIGS. 17 and 18, the pattern portion SPC according to the first aspect may be a pattern which is provided in the lower metal layer LSM to expose an electrical connection portion which electrically connects two or more different metal layers such as the semiconductor layer ACT and the connection electrode DTD. The electrical connection portion electrically connecting two or more different metal layers may be an electrode between the driving transistor DT and the organic light emitting diode OLED as described above with reference to FIG. 5 and may be defined as a portion on which a repair process is performed.

To perform repair according to the first aspect, when a laser beam is irradiated through the pattern portion SPC provided in the lower metal layer LSM, the electrical connection portion between the connection electrode DTD and the semiconductor layer ACT exposed through the lower metal layer LSM may be disconnected as in FIG. 19. That is, a cutting process of disconnecting an electrical connection portion electrically connecting two or more different metal layers through laser irradiation performed at a time may be completed.

As illustrated in FIG. 20, before the cutting process is performed, the semiconductor layer ACT and the connection electrode DTD may be in a state where an electrical connection relationship therebetween is maintained. Accordingly, a current (an overcurrent occurring due to a defect of a device) transferred through the semiconductor layer ACT may be transferred to the anode electrode ANO of the organic light emitting diode OLED via the connection electrode DTD.

However, as illustrated in FIG. 21, after the cutting process is performed, the semiconductor layer ACT and the connection electrode DTD may be in a state where an electrical connection relationship therebetween is disconnected. Accordingly, a current (an overcurrent occurring due to a defect of a device) transferred through the semiconductor layer ACT may not be transferred to the anode electrode ANO of the organic light emitting diode OLED or the connection electrode DTD.

A comparative example (before) of FIG. 22 may need a process which disconnects an electrode contact portion (three electrode contact portions) included in one electrode of a switching transistor SW, one electrode of a driving transistor DT, and one electrode of a sensing transistor ST when a defect of an element included in a subpixel occurs. On the other hand, a first aspect (after) of FIG. 22 may need a process which disconnects an electrode electrical connection portion (one electrical connection portion) included in one side of the driving transistor DT when a defect of an element included in a subpixel occurs.

The reason that there is a difference between the comparative example (before) and the first aspect (after) may be based on the presence of a structure where a main current path through which an overcurrent flows in a subpixel may be disconnected by only one process when a defect of an element included in the subpixel occurs.

FIGS. 23 and 24 show simulation results for describing improvements and voltage/current states of a subpixel before and after repair using the first aspect of the present disclosure.

As illustrated in FIG. 23, when repair using the first aspect of the present disclosure is performed, a problem may be solved where a source voltage Vs increases due to the occurrence of e.g. short circuit of a driving transistor or a current Oled of an organic light emitting diode increases, in driving of a subpixel. Also, as illustrated in FIG. 24, when repair using the first aspect of the present disclosure is performed, a problem may be solved where a reference voltage Ref increases in sensing of a subpixel.

FIGS. 25 to 27 are diagrams for describing a structure of a second aspect where one side of a connection electrode is not fully occluded by a lower metal layer and a portion thereof is exposed.

Referring to FIGS. 25 to 27, except for that a pattern portion SPC is formed in a tetragonal hole shape where a portion of one side of a lower metal layer LSM is removed for exposing a portion of one side of a connection electrode DTD, the second aspect may be the same as the first aspect. However, the pattern portion SPC according to the second aspect may be formed based on a size or a shape of an electrical connection portion to smoothly disconnect the electrical connection portion where an electrical connection between a semiconductor layer ACT and the connection electrode DTD is formed.

As described above, because the pattern portion SPC may be formed in all shapes enabling the exposure of the electrical connection portion where an electrical connection between the semiconductor layer ACT and the connection electrode DTD is formed, the present disclosure is not limited to the structures illustrated and described in the first aspect and the second aspect. Furthermore, the pattern portion SPC illustrated and described in the first aspect and the second aspect is not limited to a tetragonal shape and may be formed in a circular, triangular, or polygonal shape.

As described above, the present disclosure may considerably enhance a yield rate and may decrease a time taken in a repair process, based on a repair structure and method (1 point hole repair) capable of disconnecting a main current path, through which an overcurrent flows in a subpixel, through only one process when a defect of an element included in the subpixel occurs.

The effects according to the present disclosure are not limited to the above examples, and other various effects may be included in the specification.

It will be apparent to those skilled in the art that various modifications and variations can be made in the light emitting display apparatus and a method of repairing the same of the present disclosure without departing from the spirit or scope of the aspects. Thus, it is intended that the present disclosure covers the modifications and variations of the aspects provided they come within the scope of the appended claims and their equivalents.

What is claimed is:

1. A light emitting display apparatus comprising:
a substrate;
a lower metal layer disposed on the substrate;
a driving transistor disposed on the lower metal layer;
a connection electrode connected with an electrode of the driving transistor; and
a light emitting diode including an anode electrode connected with the electrode of the driving transistor by the connection electrode,
wherein the lower metal layer has a pattern portion exposing a portion of the connection electrode, and
wherein the pattern portion exposes an electrical connection portion electrically connecting the electrode of the driving transistor with the connection electrode in a backside direction of the substrate.

2. The light emitting display apparatus of claim 1, wherein the pattern portion has a shape where a portion of one side of the lower metal layer is removed.

3. The light emitting display apparatus of claim 1, wherein the pattern portion has a hole shape where a portion of one side of the lower metal layer is removed.

4. The light emitting display apparatus of claim 3, wherein the electrode of the driving transistor has a portion including a semiconductor layer, and the connection electrode has a portion including a gate metal layer disposed above the semiconductor layer.

5. The light emitting display apparatus of claim 4, further comprising:
a buffer layer on the lower metal layer,
the semiconductor layer disposed on the buffer layer and selected as the electrode of the driving transistor,
the gate metal layer connected with the semiconductor layer, connected with the lower metal layer through a contact hole of the buffer layer, and selected as the connection electrode;

16 a passivation layer disposed on the semiconductor layer and the gate metal layer;
an overcoat layer disposed on the passivation layer; and
a pixel electrode layer disposed on the overcoat layer, connected with the gate metal layer through a contact hole of the overcoat layer and of the passivation layer, and selected as an anode electrode of the light emitting diode.

6. The light emitting display apparatus of claim 5, wherein among the semiconductor layer, the lower metal layer and the gate metal layer, at least one layer is not overlapped with a different layer.

7. A method of repairing a light emitting display apparatus, the method comprising:
a process of manufacturing a display panel including a plurality of subpixels each including a lower metal layer disposed on a substrate, a driving transistor disposed on the lower metal layer, a connection electrode connected with an electrode of the driving transistor, and a light emitting diode including an anode electrode connected with the electrode of the driving transistor by the connection electrode, the lower metal layer including a pattern portion exposing a portion of the connection electrode;
a detecting process of detecting an abnormal subpixel from among the plurality of subpixels by using inspection of the display panel; and
a repairing process of repairing the detected abnormal subpixel,
wherein the repairing process performs a cutting process of disconnecting an electrical connection portion where the electrode of the driving transistor is electrically connected with the connection electrode.

8. The method of claim 7, wherein the cutting process comprises an irradiating process of irradiating laser beam onto an electrical connection portion exposed in a backside direction of the substrate.

9. The method of claim 7, wherein the pattern portion has a shape where a portion of one side of the lower metal layer is removed.

10. The method of claim 7, wherein the pattern portion has a hole shape where a portion of one side of the lower metal layer is removed.

11. The method of claim 7, wherein the electrode of the driving transistor has a portion including a semiconductor layer, and the connection electrode comprises a portion including a gate metal layer disposed above the semiconductor layer.

* * * * *